(12) United States Patent
Ito

(10) Patent No.: US 9,165,811 B2
(45) Date of Patent: Oct. 20, 2015

(54) AUTOMATED WAREHOUSE

(75) Inventor: Yasuhisa Ito, Inuyama (JP)

(73) Assignee: Murata Machinery, Ltd., Kyoto (JP)

( * ) Notice: Subject to any disclaimer, the term of this patent is extended or adjusted under 35 U.S.C. 154(b) by 189 days.

(21) Appl. No.: 13/638,683

(22) PCT Filed: Apr. 2, 2010

(86) PCT No.: PCT/JP2010/002442
§ 371 (c)(1),
(2), (4) Date: Oct. 1, 2012

(87) PCT Pub. No.: WO2011/125095
PCT Pub. Date: Oct. 13, 2011

(65) Prior Publication Data
US 2013/0022429 A1    Jan. 24, 2013

(51) Int. Cl.
*B65G 1/04*    (2006.01)
*H01L 21/677*    (2006.01)

(52) U.S. Cl.
CPC ............ *H01L 21/67769* (2013.01); *B65G 1/04* (2013.01); *B65G 2201/0297* (2013.01)

(58) Field of Classification Search
CPC .... B65G 1/00; B65G 1/04; B65G 2201/0297; H01L 21/67769
USPC ........................................................ 414/267
See application file for complete search history.

(56) References Cited

U.S. PATENT DOCUMENTS 4,966,513 A * 10/1990 Motoda .......................... 414/277
6,357,984 B1    3/2002 Zinger et al.
6,773,220 B1 *  8/2004 Whalen .......................... 414/267
8,123,071 B2 *  2/2012 Fitzgerald et al. ............. 221/129
2007/0237609 A1  10/2007 Nulman et al.
2010/0316471 A1 * 12/2010 Ito .................................. 414/273

FOREIGN PATENT DOCUMENTS

| JP | 05-116712 A | 5/1993 |
| JP | 09-110109 A | 4/1997 |
| JP | 10-297714 A | 11/1998 |
| JP | 2000-332093 A | 11/2000 |
| JP | 2001-298069 A | 10/2001 |
| JP | 2003-292119 A | 10/2003 |

(Continued)

OTHER PUBLICATIONS

Official Communication issued in corresponding Singapore Patent Application No. 201207335-9, mailed on Nov. 15, 2013.
English translation of Official Communication issued in corresponding International Application PCT/JP2010/002442, mailed on Dec. 13, 2012.

(Continued)

*Primary Examiner* — Saul Rodriguez
*Assistant Examiner* — Ashley Romano
(74) *Attorney, Agent, or Firm* — Keating & Bennett, LLP

(57) ABSTRACT

An automated warehouse includes an apparatus main body a transfer device. The apparatus main body includes a plurality of stationary shelves arranged horizontally and vertically, and having upper surfaces on which cassettes can be placed. The transfer device transfers the cassette by holding a flange of the cassette. The transfer device includes a vertical rail and a transfer head. The vertical rail includes an upper end adjacent to a supporting surface of a top stationary shelf. The transfer head is a member vertically movable along the vertical rail. The transfer head includes a vertical arm having a length such that the vertical arm can hold the flange of the cassette placed on the top stationary shelf.

8 Claims, 9 Drawing Sheets

(56) References Cited

FOREIGN PATENT DOCUMENTS

| JP | 2005-053642 A | 3/2005 |
|---|---|---|
| JP | 2007-273510 A | 10/2007 |
| JP | 2007-320563 A | 12/2007 |
| WO | 99/01894 A1 | 1/1999 |

OTHER PUBLICATIONS

Official Communication issued in International Patent Application No. PCT/JP2010/002442, mailed on May 11, 2010.
Official Communication issued in corresponding European Patent Application No. 10849345.3, mailed on Aug. 26, 2014.

* cited by examiner

AUTOMATED WAREHOUSE

BACKGROUND OF THE INVENTION

1. Field of the Invention

The present invention relates to an automated warehouse, and more specifically to an automated warehouse which stores articles adjacent to a processing apparatus.

2. Description of the Related Art

In a manufacturing plant for semiconductors or liquid crystal products, a substrate, such as a silicon wafer or a glass plate, undergoes various processing formations, such as film forming, oxidation, and etching, so that a semiconductor device or a liquid crystal device is formed on the substrate. Between the processing apparatuses of these kinds, cassettes, which contain substrates, are conveyed by an overhead conveying vehicle in units of cassettes. At the delivery location of the cassettes between the processing apparatus and the overhead conveying vehicle, there is disposed a buffer, which is referred to as an apparatus front automated warehouse, for adjusting processing time between the overhead conveying vehicle and the processing apparatus (for example, refer to Japanese Patent Application Laid-Open No. 2001-298069).

A conventional apparatus front automated warehouse is provided with a plurality of stationary shelves for storing cassettes which are vertically arranged at intervals, and a transfer device which can transfer an article among the respective stationary shelves. The stationary shelves are vertically disposed at intervals, and the top stationary shelf is the cassette delivery location between the overhead conveying vehicle and the stationary shelves. A cassette delivery port between the processing apparatus and the stationary shelves is disposed below the bottom stationary shelf. The processing apparatus takes out a substrate from the cassette placed on this delivery port, and then processes the substrate.

The transfer device is disposed so as to face the side of the stationary shelves opposite to the processing apparatus side, and transfers the cassette among the respective stationary shelves and between the respective stationary shelves and the delivery port. By disposing such an apparatus front automated warehouse, even when a supply or carrying-out of the cassette is stagnated due to trouble in processing apparatuses and conveying apparatuses, carrying-in and carrying-out of the cassette can be continued without causing system down time.

When transporting an automated warehouse like the one disclosed in Japanese Patent Application Laid-Open No. 2001-298069, the apparatus height is restricted in the case of air transportation, and the like. Therefore, conventionally, the automated warehouse is divided into upper and lower portions so as to be individually transported. However, in this case, assembling and disassembling the automated warehouse require a lot of effort, and further, after assembling the warehouse, the transfer position of the transfer head of the transfer device may deviate from the original transfer position, i.e., the position where it was before the warehouse was divided into two portions. When the transfer position is deviated, an on-site operation for re-teaching the transfer position is required.

SUMMARY OF THE INVENTION

Preferred embodiments of the present invention reduce and solve the above-described problem in connection with transportation of an automated warehouse. The preferred embodiments of the present invention are described below and can be combined according to need or preference.

An automated warehouse according to a preferred embodiment of the present invention includes shelves and a transfer device. The shelves include a plurality of placement portions, which are arranged horizontally and vertically and which include upper surfaces on which articles can be placed. The transfer device holds an upper portion of an article and transfers the same. The transfer device includes a vertical rail and a hand member. The upper end of the vertical rail is positioned adjacent to the top placement portion. The hand member is a member vertically movable along the vertical rail. The hand member includes a vertical arm having a length such that the vertical arm can hold the upper portion of the article placed on the top placement portion.

In this automated warehouse, the height of the vertical rail upper end is preferably set to be no higher than the supporting surface of the top placement portion. In other words, the vertical rail preferably does not protrude much, or at all, above the supporting surface of the top placement portion. Accordingly, the height of the automated warehouse can be lowered. As a result, even when the hand member stays mounted, the height of the automated warehouse can be sufficiently lowered during transportation. Moreover, when in use, an article placed on the top placement portion can be grasped at its upper portion by the hand member.

Note that, the "upper end" of the vertical rail here means the portion at the highest position.

The upper end of the vertical rail may preferably be no higher than the supporting surface of the top placement portion.

In this automated warehouse, the height of the vertical rail upper end is preferably set to be no higher than the supporting surface of the top placement portion. In other words, the vertical rail preferably does not protrude above the supporting surface of the top placement portion. Accordingly, the height of the automated warehouse can be lowered. Specifically, by lowering the hand member downward, the supporting surface of the top placement portion becomes the uppermost portion. As a result, even when the hand member stays mounted, the height of the automated warehouse can be sufficiently lowered during transportation. Moreover, when in use, the hand member can grasp an upper portion of an article placed on the top placement portion.

The vertical arm may have a length which is longer than the vertical distance between a pair of placement portions arranged vertically.

The vertical arm may have a length which is shorter than the vertical distance between a pair of placement portions arranged vertically with another placement portion interposed in between.

The hand member may further include an article holding portion disposed on the upper end portion of the vertical arm. In this case, the hand member has no portion extending above the article holding portion. Accordingly, the length of the vertical arm in the upward and downward directions does not become extremely long.

The automated warehouse may be further provided with a cover removably disposed on the shelves. In this case, the cover can be removed when the automated warehouse is transported.

The cover may be configured to surround the circumference of the article placed on the top placement portion. In this case, the height of the automated warehouse during its transportation can be made lower by removing the cover.

The upper end of the cover may be located at a position not lower than the uppermost surface of the article placed on the top placement portion. In this case, the upper end of the cover is the highest portion of the automated warehouse when in use.

The lower end of the cover may be positioned adjacent to the supporting surface of the top placement portion. In this case, when the cover is removed, the portion adjacent to the supporting surface of the top placement portion becomes the highest portion of the automated warehouse.

The cover may include a plurality of divided covers. In this case, the cover can be easily detached and attached.

The automated warehouse may further include a wheel removably disposed at the lower portion of the shelves. In this case, the height of the automated warehouse during its transportation can be further lowered by removing the wheel.

According to various preferred embodiments of an automated warehouse of the present invention, a height during transportation can be lowered.

The above and other elements, features, steps, characteristics and advantages of the present invention will become more apparent from the following detailed description of the preferred embodiments with reference to the attached drawings.

BRIEF DESCRIPTION OF THE DRAWINGS

DETAILED DESCRIPTION OF THE PREFERRED EMBODIMENTS (1) Overall Configuration of Automated Warehouse With reference to FIGS. 1 and 2, an automated warehouse 10 according to a preferred embodiment of the present invention will be described. FIG. 1 is a perspective view of the automated warehouse according to a preferred embodiment of the present invention. FIG. 2 is a front view of the automated warehouse in which the outer wall panel of the automated warehouse is removed.

For example, the automated warehouse 10 is preferably an apparatus front automated warehouse which is disposed adjacent to and in front of a semiconductor processing apparatus 12, and functions as a buffer between an overhead conveying vehicle (not shown) and the semiconductor processing apparatus 12. The automated warehouse 10 preferably stores cassettes C which preferably contain a plurality of substrates before or after being processed.

The semiconductor processing apparatus 12 opens the cassette C, processes a circular substrate contained therein, and puts the processed substrate into the cassette C. A delivery port preferably is disposed at the outer circumference of the semiconductor processing apparatus 12. For example, the delivery port 14 preferably includes four cassette placement tables 14a. The delivery port 14 is disposed so as to be inserted into the apparatus main body of the automated warehouse 10.

Figure 9:
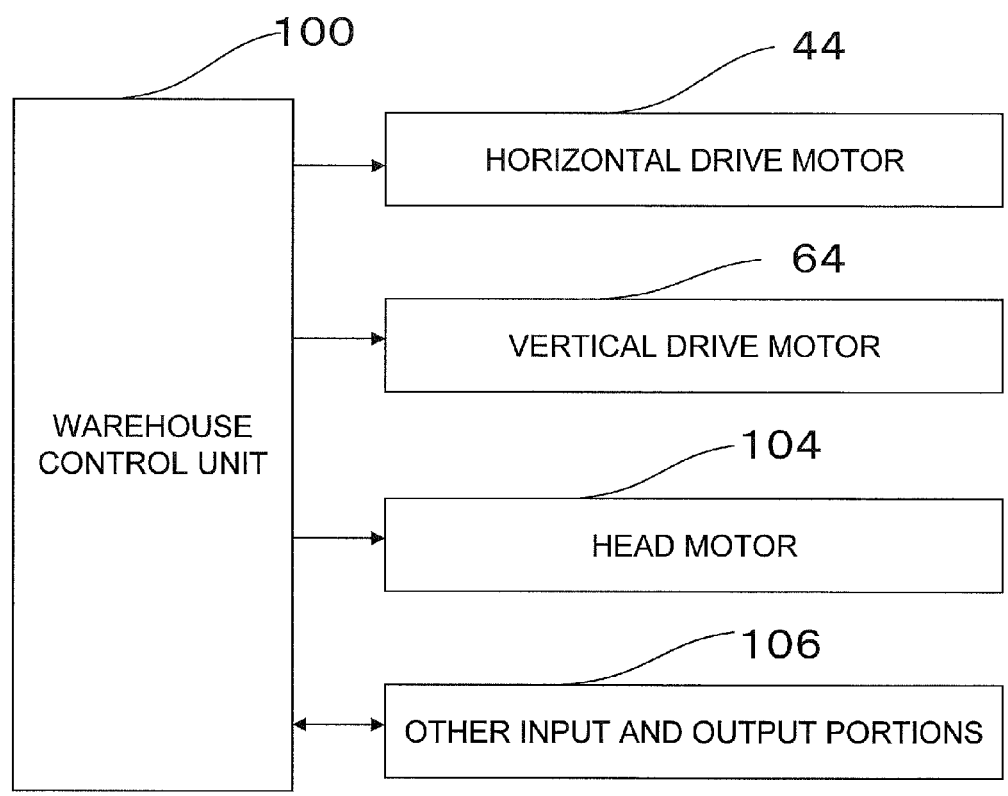
FIG. 9 is a block diagram of a control system of the automated warehouse.

The automated warehouse 10 is preferably provided with a frame 20, an outer wall panel 22 disposed so as to surround the outer surface of the frame 20, stationary shelves 24, a sliding shelf 25, and a transfer device 26. The sliding shelf 25 is preferably used in the carrying-in and carrying-out of the cassette C with respect to the automated warehouse 10 manually by an operator. The transfer device 26 is preferably controlled by a warehouse control unit 100 illustrated in FIG. 9. The transfer device 26 conveys the cassette C among the plurality of stationary shelves 24, the sliding shelf 25, and the plurality of cassette placement tables 14a.

(2) Configurations of Frame and Outer Wall Panel

Figure 1:
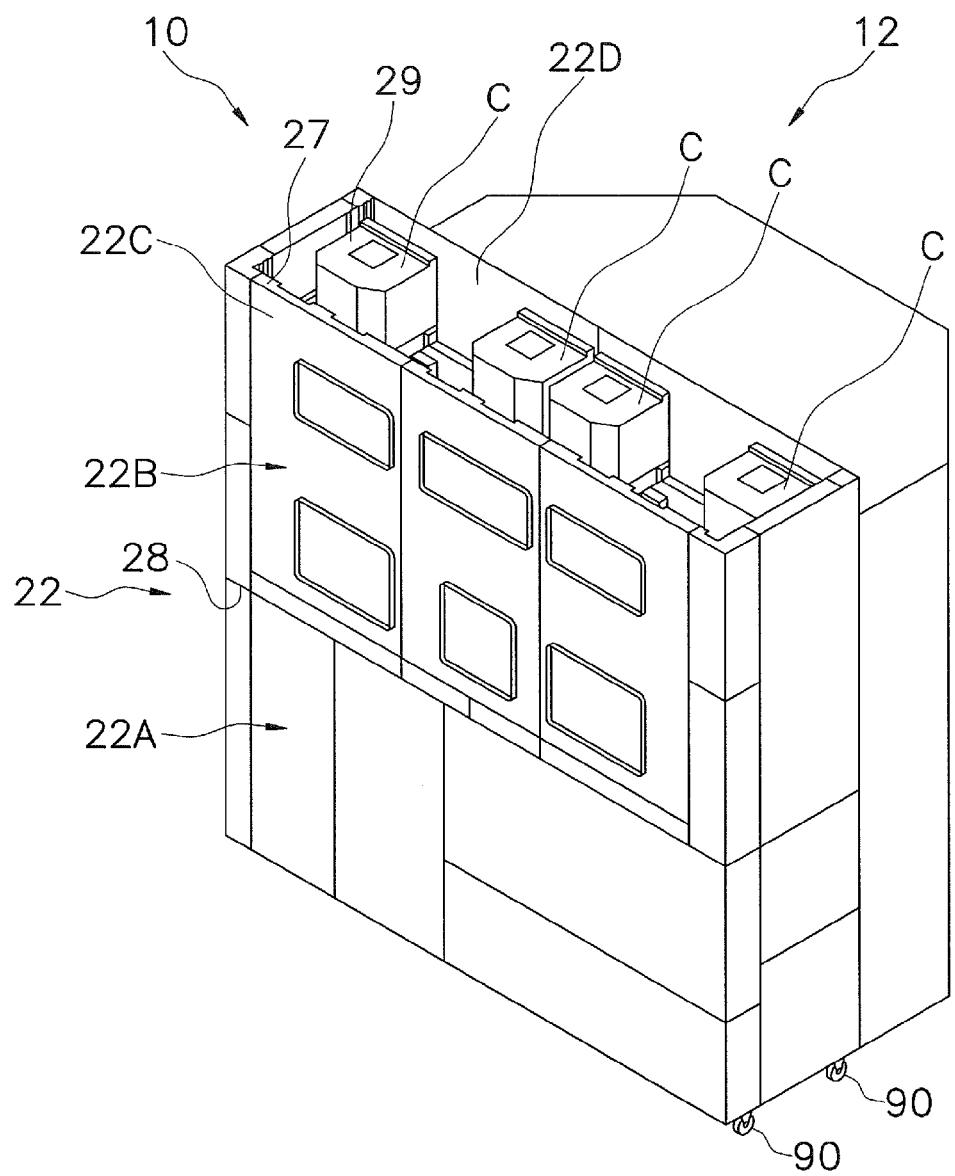
FIG. 1 is a perspective view of an automated warehouse according to a preferred embodiment of the present invention.
Figure 2:
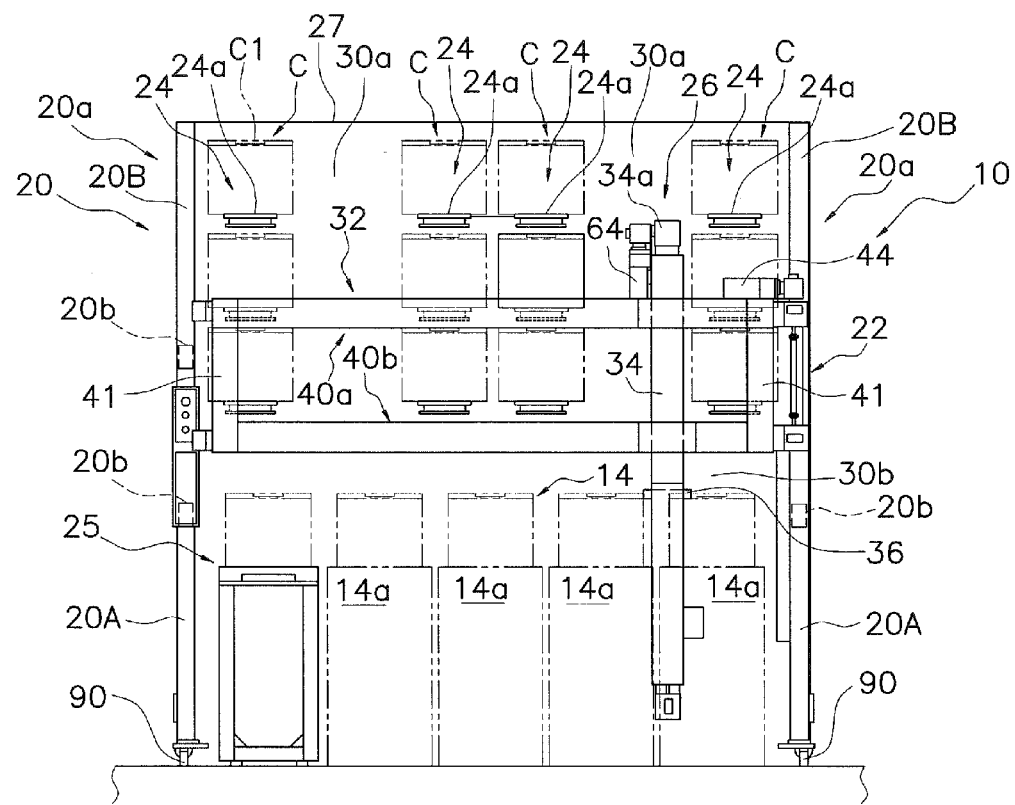
FIG. 2 is a front view of the automated warehouse in which its outer wall panel is removed.

As illustrated in FIG. 2, for example, the frame 20 preferably includes four column members 20a disposed at the four corners, and connection members 20b connecting the column members 20a in the forward, backward, left, and right directions. Note that, the connection member 20b connecting the left and right is preferably mainly disposed on the back on the semiconductor processing apparatus 12 side, and not disposed on the front.

Figure 6:
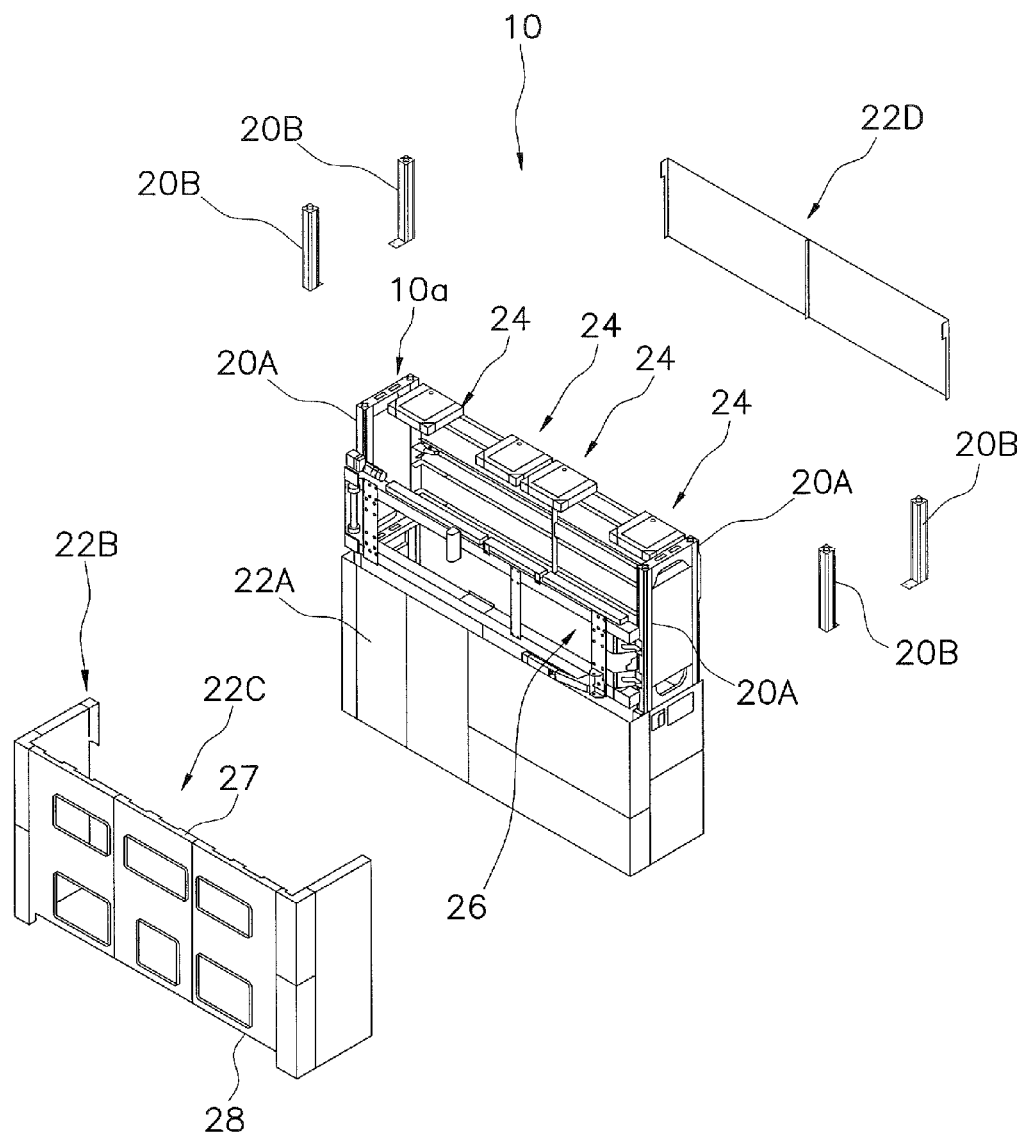
FIG. 6 is a perspective view illustrating a state in which a cover and a frame are removed from an apparatus main body for transportation.

The column member 20a preferably includes first portions 20A which are lower portions and second portions 20B which are upper portions. The connection member 20b connects the upper end portions of the first portions 20A with each other. As illustrated in FIG. 6, the second portion 20B can be removed from the first portion 20A.

The outer wall panel 22 is preferably arranged to cover the front and the left and right sides of the automated warehouse 10, and to cover the upper portion of the back. At the lower portion of the front of the outer wall panel 22, an opening is provided through which the sliding shelf 25 and the cassette C to be placed thereon may be passed.

The outer wall panel 22 preferably includes a first cover 22A which covers the lower half of the apparatus main body 10a, and a second cover 22B which covers the upper half of the apparatus main body 10a. The second cover 22B preferably corresponds to the entire second portion 20B of the column member 20a and the upper portion of the first portion 20A. The second cover 22B preferably surrounds the circumference of the cassette C when the cassette C is placed on the top stationary shelf 24, and its height is preferably higher than the above-mentioned cassette C. In other words, the upper end 27 of the second cover 22B is located at a position that is not lower than the upper surface 29 of the cassette C placed on the top stationary shelf 24. Accordingly, when the automated warehouse 10 is used, the upper end 27 of the second cover 22B will preferably be the highest portion of the automated warehouse 10. On the other hand, the lower end 28 of the second cover 22B is preferably located at a position adjacent to a supporting surface 24a of the top stationary shelf 24, specifically, at a position that is not higher than the supporting surface 24a. Accordingly, when the second cover 22B is removed, the supporting surface 24a of the top stationary shelf 24 will preferably be the highest portion of the automated warehouse 10.

Moreover, as illustrated in FIG. 6, the second cover 22B can preferably be divided into a front cover 22C which defines the front and the two sides, and a rear cover 22D which defines the back. Therefore, the second cover 22B can be easily detached and attached.

Wheels 90 are preferably fixed to the lower portion of the frame 20. The wheels 90 can be removed from the frame 20.

(3) Configuration of Stationary Shelves

As illustrated in FIG. 2, the stationary shelves 24 are preferably disposed in the upward and downward directions and the left and right directions. In this preferred embodiment, there are preferably four columns arranged in the left and right directions, and three rows arranged in the upward and downward directions, so that twelve stationary shelves 24 are preferably disposed in total. However, it is not that any other desirable number of stationary shelves 24 could be used instead. The top stationary shelves 24 are preferably used to deliver cassettes C to or from an overhead conveying vehicle (not shown). The stationary shelves 24 are preferably fixed to the left and right connection members 20b of the frame 20. The stationary shelves 24 are disposed above the delivery port 14 within a predetermined space.

The stationary shelf 24 is preferably provided with a cassette reading device (not shown) which identifies the cassette C. A positioning mechanism (not shown) arranged to position the cassette C is preferably disposed at the supporting surface 24a of the stationary shelf 24.

In the left and right directions, between the stationary shelves 24, there is preferably disposed a vertical passage 30a through which the transfer device 26 can pass vertically. In this preferred embodiment, the stationary shelves 24 are arranged such that the stationary shelf 24, the vertical passage 30a, the stationary shelf 24, the stationary shelf 24, the vertical passage 30a, and the stationary shelf 24, are preferably arranged in this order in the left and right directions. All of the stationary shelves 24 face the vertical passages 30a. With this, the transfer device 26 can transfer the cassette C among all of the stationary shelves 24 and the delivery port 14.

A horizontal passage 30b is preferably provided between the bottom stationary shelf 24 and the delivery port 14.

(4) Configuration of Transfer Device

Figure 3:
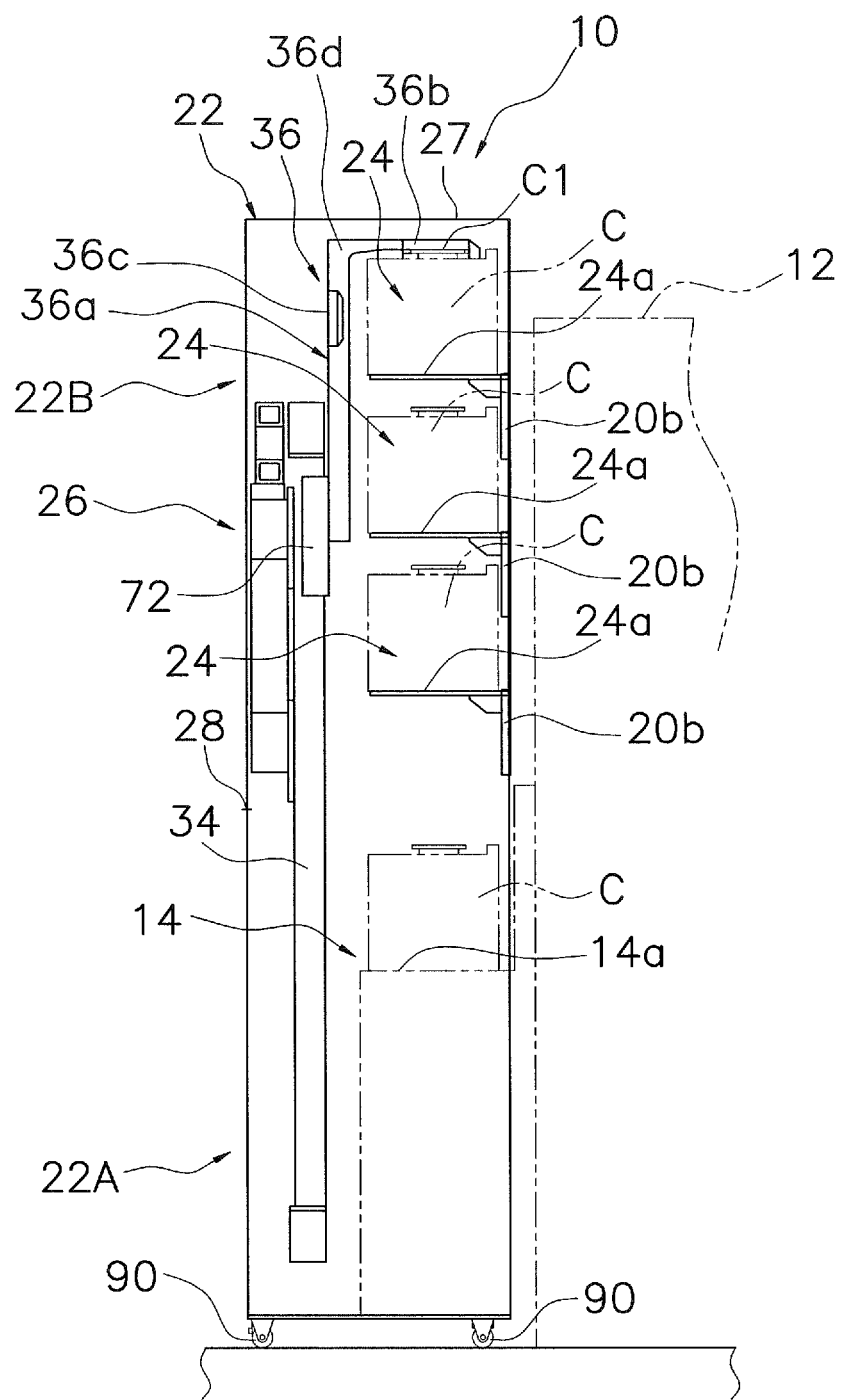
FIG. 3 is a cross-sectional side view of the automated warehouse.
Figure 4:
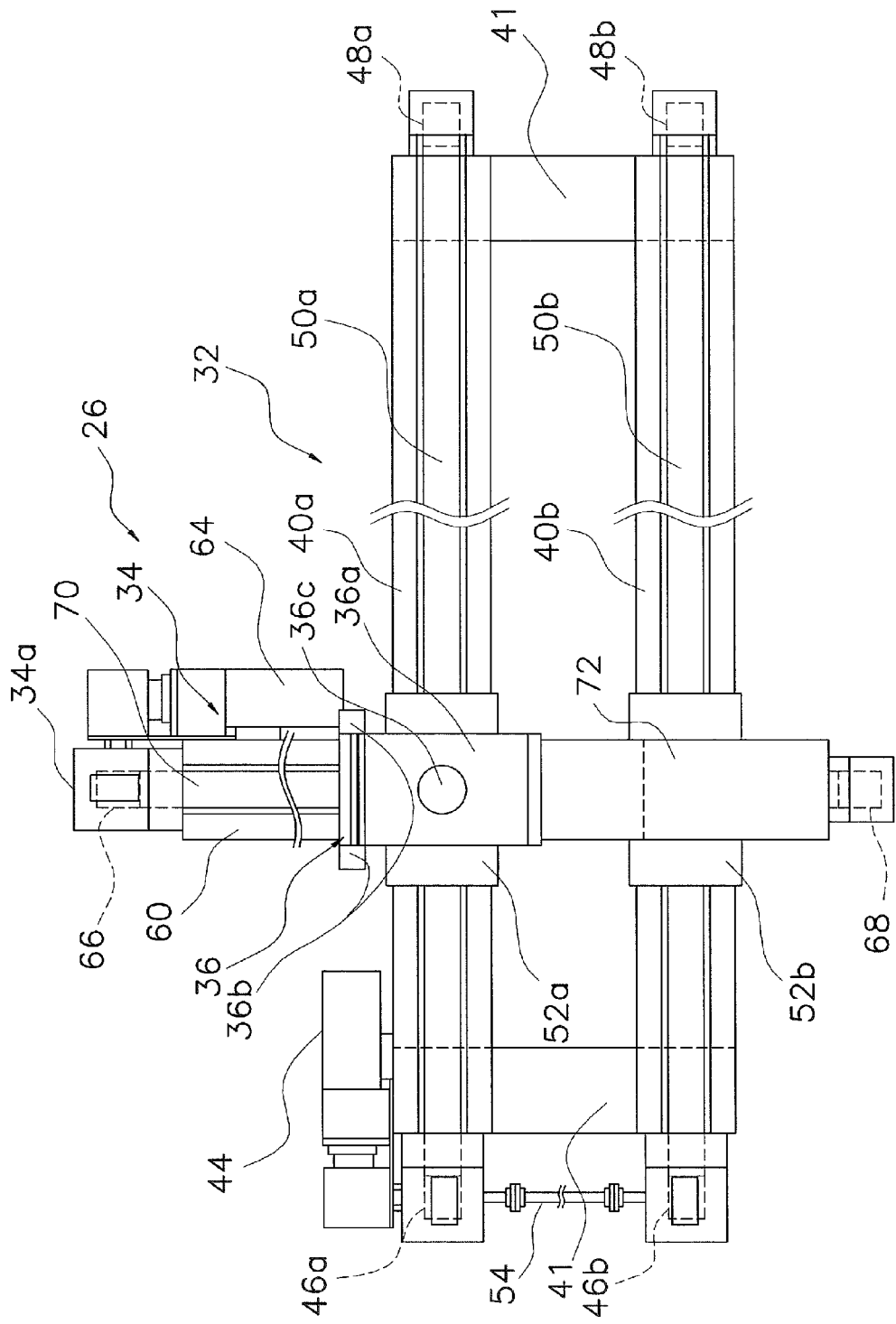
FIG. 4 is an enlarged front view of a transfer device.

With reference to FIGS. 2 to 4, the transfer device 26 is described. FIG. 3 is a cross-sectional side view of the automated warehouse. FIG. 4 is an enlarged front view of the transfer device.

The transfer device 26 is a device which has two axes, i.e., a horizontal axis along the left and right directions, and a vertical axis, and is able to hold the cassette C. The transfer device 26 preferably includes a horizontal rail 32, a vertical rail 34 which moves along the horizontal rail 32, and a transfer head 36 which moves along the vertical rail 34 independently of the vertical rail 34. The horizontal rail 32 is disposed in the horizontal direction on the front side of the stationary shelves 24 and disposed to define a space between itself and the stationary shelves 24.

As illustrated in FIG. 2, the horizontal rail 32 is disposed along the left and right directions. As illustrated in FIG. 4, the horizontal rail 32 preferably includes an upper rail member 40a and a lower rail member 40b, a horizontal drive motor 44, an upper drive pulley 46a and a lower drive pulley 46b, an upper driven pulley 48a and a lower driven pulley 48b, and an upper toothed belt 50a and a lower toothed belt 50b. The horizontal drive motor 44 is a device arranged to drive the vertical rail 34 in the horizontal direction. The upper rail member 40a and the lower rail member 40b are preferably connected with each other by connection members 41 which are disposed in the upward and downward directions at both end portions.

The horizontal drive motor 44 is preferably a motor with a reduction gear fixed to the left end, i.e. left end in FIG. 4 (the right end in FIG. 2), of the upper rail member 40a, and can output its rotation with a rotation axis being in the vertical direction. The output of the horizontal drive motor 44 is transmitted to the upper drive pulley 46a, and to the lower drive pulley 46 via a connection shaft 54. The upper drive pulley 46a and the lower drive pulley 46b are preferably disposed at the right ends, i.e. right ends in FIG. 2 (the left ends in FIG. 4), of the upper rail member 40a and the lower rail member 40b. The upper driven pulley 48a and the lower driven pulley 48b are preferably disposed at the left ends in FIG. 2 (the right ends in FIG. 4) of the upper rail member 40a and the lower rail member 40b. The upper toothed belt 50a is preferably wound around the upper drive pulley 46a and the upper driven pulley 48a. An upper slider 52a, which is guided in the horizontal direction by the upper rail member 40a, is preferably fixed to the upper toothed belt 50a. A lower slider 52b, which is guided in the horizontal direction by the lower rail member 40b, is preferably fixed to the lower toothed belt 50b. The vertical rail 34 is fixed to the upper slider 52a and the lower slider 52b.

As illustrated in FIG. 4, the vertical rail 34 preferably includes a vertical rail member 60, a vertical drive motor 64 arranged to drive the transfer head 36 in the vertical direction, a drive pulley 66, a driven pulley 68, and a toothed belt 70. These configurations are preferably the same as the upper rail member 40a of the horizontal rail 32. The transfer head 36 is fixed to a slider 72 which is fixed to the toothed belt 70.

The transfer head 36 preferably includes a vertical arm 36a and article holding portions 36b disposed at the upper end portion 36d of the vertical arm 36a. The vertical arm 36a extends in the upward and downward directions, and is disposed along the vertical rail 34. As illustrated in FIG. 3, the article holding portions 36b preferably include a pair of members which are arranged to hold a flange C1 that protrudes from the upper surface of the cassette C. The pair of article holding portions 36b are disposed so as to preferably be opened and closed in the left and right directions (the directions orthogonal to the sheet of FIG. 3). A cassette identification sensor 36c arranged to identify the cassette C is disposed at a position of the transfer head 36 that can be positioned opposite to the cassette C. The transfer head 36 preferably further includes a head motor 104 (FIG. 9) which opens and closes the article holding portions 36b. The transfer head 36 opens and closes the article holding portions 36b so as to hold and release the flange C1 when carrying the cassette C into the stationary shelves 24 and carrying the cassette C out of the stationary shelves 24. The transfer head 36 is guided along the horizontal rail 32 and the vertical rail 34 so as to be moved in the two vertical passages 30a and the horizontal passage 30b.

The slider 72 is preferably mounted at the lower end portion of the vertical arm 36a.

Note that, the configuration of the article holding portions of the transfer head is not limited to the above-mentioned opening and closing type. For example, the article holding portions may use a configuration in which the article holding portions are laterally moved so as to pick up the flange of the cassette.

An upper end 34a of the vertical rail 34 is preferably positioned lower than the supporting surface 24a of the top stationary shelf 24. More specifically, the position of the uppermost surface of the vertical rail 34 in the upward and downward directions is preferably slightly lower than the position of the supporting surface 24a of the top stationary shelf 24 in the upward and downward directions.

On the other hand, the vertical arm 36a of the transfer head 36 preferably has a length which enables the transfer head 36 to hold the flange C1 of the cassette C placed on the top stationary shelf 24. Specifically, the vertical arm 36a is preferably longer than the distance from the uppermost position of the vertical rail 34 to the flange C1 of the cassette C placed on the top stationary shelf 24. The length of the vertical arm 36a is preferably longer than the distance in the upward and downward directions between a pair of adjacent stationary shelves 24 arranged in the upward and downward directions, and is shorter than the distance in the upward and downward directions between the top stationary shelf 24 and the bottom stationary shelf 24.

Figure 5:
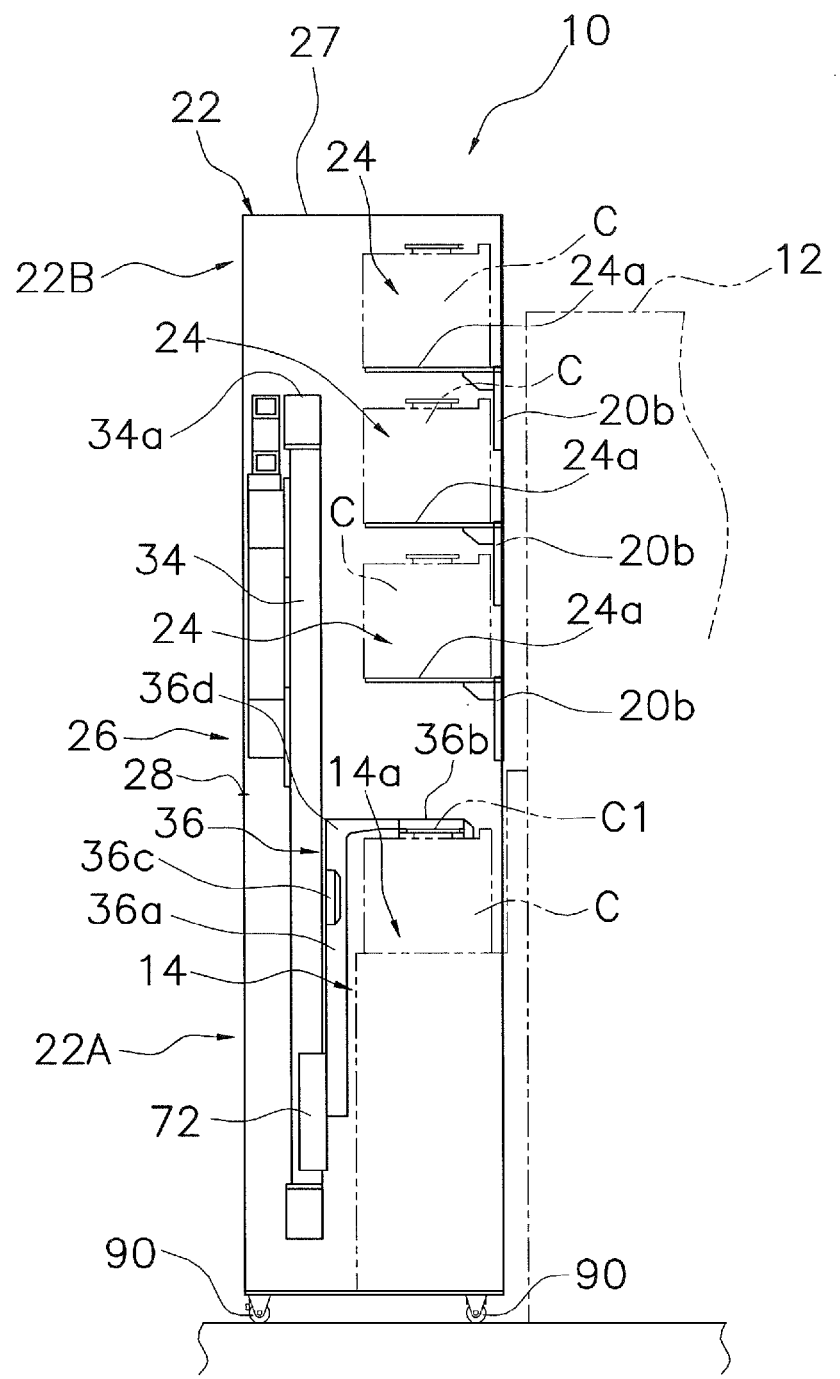
FIG. 5 is a cross-sectional side view of the automated warehouse.

According to the above-mentioned configuration, as illustrated in FIG. 4, the transfer head 36 can move to the highest position with respect to the vertical rail 34, and hold the flange C1 of the cassette C placed on the top stationary shelf 24. Moreover, as illustrated in FIG. 5, the transfer head 36 can move to the lowermost position with respect to the vertical rail 34, and hold the flange C1 of the cassette C placed on the delivery port 14.

The article holding portion 36b is preferably disposed at the upper end portion 36d of the vertical arm 36a so that the transfer head 36 has no portion extending above the article holding portion 36b. Therefore, the length of the vertical arm 36a in the upward and downward directions does not become extremely long.

Because the uppermost portion of the vertical rail 34 is close to the top stationary shelf 24, even if the length of the vertical arm 36a in the upward and downward directions is not extremely long, the article holding portions 36b can hold the cassette C placed on the top stationary shelf 24.

(5) Configuration of Control System

For example, the warehouse control unit 100 preferably includes a microcomputer. The warehouse control unit 100 is preferably arranged and programmed to control the horizontal drive motor 44, the vertical drive motor 64, and the head motor 104 of the transfer device 26, by using software, for example. Moreover, the horizontal drive motor 44, the vertical drive motor 64, and the head motor 104, and other input and output portions 106 are connected with the warehouse control unit 100. Other input and output portions 106 here mean, for example, devices arranged to input and output data to and from other sensors, such as, for example, the cassette identification sensor 36c, and external apparatuses, such as, for example, the semiconductor processing apparatus 12.

(6) Operation of Automated Warehouse

In the automated warehouse 10 configured in this manner, the overhead conveying vehicle (not shown) carries the cassette C into any of the top stationary shelves 24. Next, the transfer device 26 transfers the carried-in cassette C through the vertical passage 30a, which the top stationary shelf 24 with the carried-in cassette C faces, to any of the stationary shelves 24 in the lower two rows of the two columns. Moreover, depending on the transfer instruction, the transfer device 26 may directly transfer the cassette C to either the cassette placement table 14a of the delivery port 14 or the sliding shelf 25.

When the above-mentioned transfer operation is performed, first, the transfer head 36 moves above the center of the cassette C to be transferred with the article holding portions 36b opened. Specifically, the transfer head 36 moves to the vertical passage 30a, which the cassette C to be transferred faces, and moves upward along the vertical rail 34. Then, when reaching above the cassette C, the transfer head 36 moves to the center of the cassette C horizontally along the horizontal rail 32. Next, the transfer head 36 moves downward, and finally, closes the article holding portions 36b so as to hold the flange C1. With this, the flange C1 is held, and the cassette C can be transferred.

In the above-mentioned operation, the vertical arm 36a of the transfer head 36 moves along the vertical rail 34 when moving upward and downward.

As illustrated in FIG. 3, when the cassette C placed on the top stationary shelf 24a is to be held, the vertical arm 36a is supported at the highest position of the vertical rail 34, and the upper half of the vertical arm 36a and the article holding portions 36b extend to a position which is preferably higher than the upper end surface of the vertical rail 34. At this time, the slider 72 is located adjacent to the highest position of the portion which can be supported by the vertical arm 36a. As illustrated in FIG. 5, when the cassette C placed on the cassette placement table 14a is to be held, the vertical arm 36a is preferably supported at the lowest position of the vertical rail 34, and the lower half of the vertical arm 36a extends to a position lower than the cassette placement table 14a. At this time, the slider 72 is preferably positioned adjacent to the lowest position of the portion which can be supported by the vertical arm 36a.

(7) Disassembling Operation for Transportation

Figure 7:
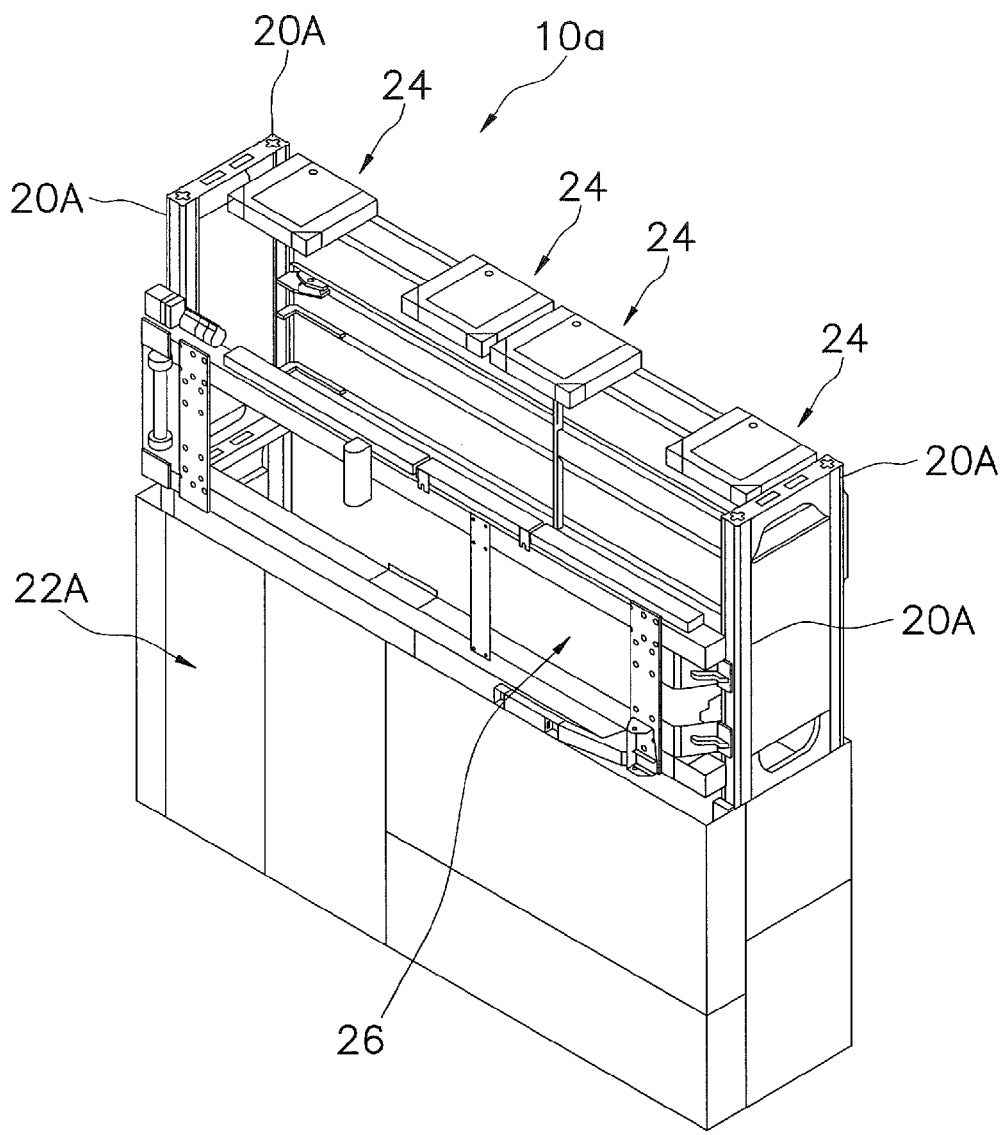
FIG. 7 is a perspective view of the apparatus main body when being transported.
Figure 8:
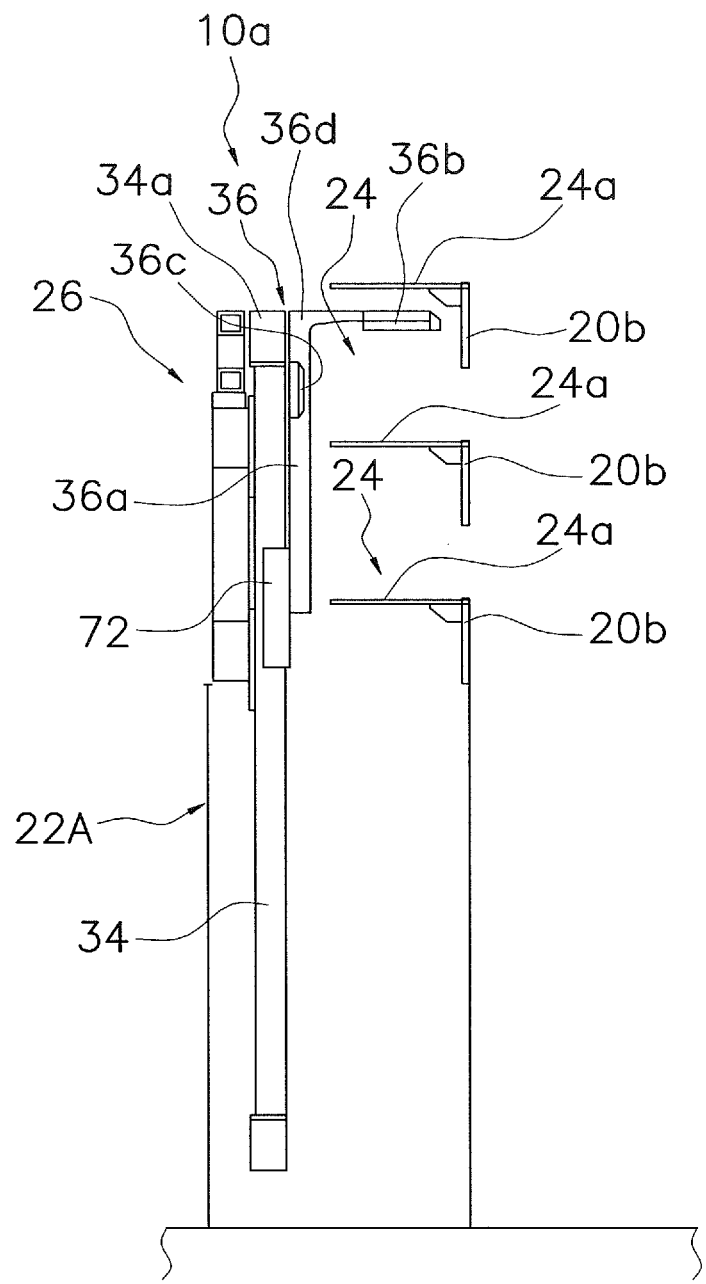
FIG. 8 is a cross-sectional side view of the automated warehouse.

When the automated warehouse 10 is to be transported, as illustrated in FIG. 6, the front cover 22C and the rear cover 22D of the second cover 22B are removed from the apparatus main body 10a, and further the second portion 20B of the column member 20a is removed from the apparatus main body 10a. FIGS. 7 and 8 illustrate the apparatus main body of the automated warehouse 10 in which the above-mentioned members have been removed. FIG. 7 is a perspective view of the apparatus main body during transportation. FIG. 8 is a cross-sectional side view of the automated warehouse.

In this automated warehouse 10, because the upper end 34a of the vertical rail 34 is positioned adjacent to the supporting surface 24a of the top stationary shelf 24, specifically, not higher than the supporting surface 24a, the vertical rail 34 preferably protrudes only slightly above, if at all, the supporting surface 24a of the top stationary shelf 24. Moreover, during transportation, as illustrated in FIG. 8, the transfer head 36 is preferably suspended downward from the uppermost position. As a result, the transfer head 36 is disposed below the supporting surface 24a of the top stationary shelf 24. Therefore, the highest portion of the apparatus main body 10a of the automated warehouse 10 during transportation is the supporting surface 24a of the top stationary shelf 24. As a result, while the vertical rail 34 of the transfer device 26 and the transfer head 36 stay mounted, the height of the automated warehouse 10 during transportation can preferably be lowered.

Moreover, by removing the wheels 90 from the apparatus main body 10a, the height of the automated warehouse 10 during transportation can be further lowered.

As mentioned above, since the transfer device 26 is not disassembled when transported, the transfer position re-teaching does not need to be performed on site to the transfer device 26 after transportation.

Moreover, in the above-mentioned preferred embodiment, as compared with the automated warehouse which is transported after the entire apparatus is divided into upper and lower portions, the disassembling operation can be minimized, and the assembling operation on site can be also minimized. In the above-mentioned preferred embodiment, special equipment, such as, for example, an overhead travelling crane, is unnecessary for the on-site operation.

(8) Other Preferred Embodiments

A preferred embodiment of the present invention has been described above. However, the present invention is not limited to the above-mentioned preferred embodiment, and can be variously modified in the scope without departing from the gist of the present invention. Specifically, the plurality of preferred embodiments and modified examples described herein can be combined according to need or preference.

The configuration used to hold the cassette in the transfer device is not limited to the above-mentioned preferred embodiments. For example, the holding portion may have a hook shape, and engage the protruding portion of the cassette from the lateral direction.

The configuration of the cover defining the outer wall panel is not limited to the above-mentioned preferred embodiment. For example, the cover may be configured to cover the upper surface of the shelf. In this case, the cassette is carried in from the front of the automated warehouse.

The preferred embodiments of the present invention can be widely applied to an automated warehouse, specifically, an automated warehouse which stores articles adjacent to a processing apparatus.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

The invention claimed is:

1. An automated warehouse comprising:
    shelves including a plurality of placement portions arranged horizontally and vertically, the placement portions including upper surfaces on which an article can be placed; and
    a transfer device arranged to hold an upper portion of the article and transfer the article; wherein
    the transfer device includes:
        a vertical rail including an upper end positioned adjacent to a supporting surface of a top placement portion; and
        a hand member vertically movable along the vertical rail and including a vertical arm having a length such that the vertical arm can hold the upper portion of the article placed on the top placement portion;
    the upper end of the vertical rail is positioned no higher than the supporting surface of the top placement portion;
    the vertical arm has a length which is longer than a vertical distance between a pair of the placement portions arranged vertically; and
    the automated warehouse further comprises:
        a frame to which the shelves are secured, the frame including four columns provided at four corners of the shelves;
        a first cover provided at the shelves; and
        a second cover removably disposed on the shelves;
    the columns each include a lower portion and a removable upper portion;
    the second cover corresponds to the upper portion of each of the columns;
    when the second cover is removed from the automated warehouse, the upper portion of each of the columns is able to be removed;
    the second cover is arranged to surround a circumference of the article placed on the top placement portion; and
    an upper end of the second cover is located at a position no lower than an upper surface of the article placed on the top placement portion.

2. The automated warehouse according to claim 1, wherein the vertical arm has a length which is shorter than a vertical distance between a pair of the placement portions arranged vertically with another placement portion interposed in between.

3. The automated warehouse according to claim 2, wherein the hand member includes an article holding portion disposed on an upper end portion of the vertical arm.

4. The automated warehouse according to claim 1, wherein the hand member includes an article holding portion disposed on an upper end portion of the vertical arm.

5. The automated warehouse according to claim 1, further comprising a wheel removably disposed at a lower portion of the shelves.

6. The automated warehouse according to claim 1, wherein the first cover is arranged to surround a lower part of the shelves, and the second cover is arranged to surround an upper part of the shelves.

7. The automated warehouse according to claim 1, wherein the frame further includes connection members that connect the lower portions of the columns with each other.

8. The automated warehouse according to claim 1, wherein the shelves are fixed to the connection members.

\* \* \* \* \*